(12) United States Patent
Hase

(10) Patent No.: US 9,143,097 B2
(45) Date of Patent: Sep. 22, 2015

(54) RF POWER AMPLIFIER AND OPERATING METHOD THEREOF

(71) Applicant: RENESAS ELECTRONICS CORPORATION, Kanagawa (JP)

(72) Inventor: Masatoshi Hase, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/604,944

(22) Filed: Jan. 26, 2015

(65) Prior Publication Data

US 2015/0137894 A1    May 21, 2015

Related U.S. Application Data

(63) Continuation of application No. 13/705,328, filed on Dec. 5, 2012, now Pat. No. 8,970,299.

(30) Foreign Application Priority Data

Dec. 20, 2011   (JP) ................................. 2011-277953

(51) Int. Cl.
*H03F 3/193* (2006.01)
*H03F 3/24* (2006.01)
*H04B 1/04* (2006.01)

(52) U.S. Cl.
CPC ............... *H03F 3/193* (2013.01); *H03F 3/245* (2013.01); *H03F 2200/387* (2013.01); *H03F 2200/451* (2013.01); *H03F 2200/465* (2013.01); *H04B 2001/0408* (2013.01)

(58) Field of Classification Search
CPC ...................................................... H03F 1/191
USPC .................................. 330/140, 149, 302–306
See application file for complete search history.

(56) References Cited

U.S. PATENT DOCUMENTS 5,929,722 A    7/1999   Kono
6,307,364 B1  10/2001  Augustine
(Continued)

FOREIGN PATENT DOCUMENTS

EP    1972066 B1    9/2008
JP    7-227003 A    8/1995
(Continued)

OTHER PUBLICATIONS

Madic et al., "Accurate Power Control Technique for Handset PA Modules with Integrated Directional Couplers", 2003 IEEE Radio Frequency Integrated Circuits Symposium, 2003, pp. 715-718.
(Continued)

*Primary Examiner* — Khanh V. Nguyen
*Assistant Examiner* — Khiem Nguyen
(74) *Attorney, Agent, or Firm* — Mattingly & Malur, PC

(57) ABSTRACT

A multiband RF power amplifier includes a first band RF amplifier circuit, a second band RF amplifier circuit and a second band power detection circuit. The second band RF amplifier circuit subjects an RF input signal having a frequency band to power amplification and generates an RF amplifier output signal. The input terminal of the second band power detection circuit is coupled to the output of the second band RF amplifier circuit. The second band power detection circuit detects a harmonic component that is a whole number multiple of a fundamental wave component of the RF amplifier output signal, and generates a detected signal indicating the fundamental wave component. The second band power detection circuit includes an input circuit, which detects the harmonic component, and an output circuit, which generates the detected signal.

20 Claims, 5 Drawing Sheets

(56) References Cited

U.S. PATENT DOCUMENTS

| | | | |
|---|---|---|---|
| 6,545,536 | B1 | 4/2003 | Haczewski et al. |
| 2002/0105384 | A1 | 8/2002 | Dent |

FOREIGN PATENT DOCUMENTS

| | | |
|---|---|---|
| JP | 10-154917 A | 6/1998 |
| JP | 2003-318750 A | 11/2003 |
| JP | 2009-523340 A | 6/2009 |
| JP | 2011-530241 A | 12/2011 |
| WO | 2010-014984 A2 | 2/2010 |

OTHER PUBLICATIONS

Scuderi et al., "A VSWR-Protected Silicon Bipolar RF Power Amplifier With Soft-Slope Power Control", IEEE Journal of Solid-State Circuits, Mar. 3, 2005, pp. 611-621, vol. 40, No. 3.

Japanese Office Action received in corresponding Japanese Application No. 2011-277953 dated Jul. 2, 2015.

FIG. 5

| Band | Uplink Frequency | Downlink Frequency | Duplex Mode |
|---|---|---|---|
| 1 | 1920MHz - 1980MHz | 2110MHz - 2170MHz | FDD |
| 2 | 1850MHz - 1910MHz | 1930MHz - 1990MHz | FDD |
| 3 | 1710MHz - 1785MHz | 1805MHz - 1880MHz | FDD |
| 4 | 1710MHz - 1755MHz | 2110MHz - 2155MHz | FDD |
| 5 | 824MHz - 849MHz | 869MHz - 894MHz | FDD |
| 6 | 830MHz - 840MHz | 875MHz - 885MHz | FDD |
| 7 | 2500MHz - 2570MHz | 2620MHz - 2690MHz | FDD |
| 8 | 880MHz - 915MHz | 925MHz - 960MHz | FDD |
| 9 | 1749.9MHz - 1784.9MHz | 1844.9MHz - 1879.9MHz | FDD |
| 10 | 1710MHz - 1770MHz | 2110MHz - 2170MHz | FDD |
| 11 | 1427.9MHz - 1447.9MHz | 1475.9MHz - 1495.9MHz | FDD |
| 12 | 698MHz - 716MHz | 728MHz - 746MHz | FDD |
| 13 | 777MHz - 787MHz | 746MHz - 756MHz | FDD |
| 14 | 788MHz - 798MHz | 758MHz - 768MHz | FDD |
| 15 | Reserved | Reserved | FDD |
| 16 | Reserved | Reserved | FDD |
| 17 | 704MHz - 716MHz | 734MHz - 746MHz | FDD |
| 18 | 815MHz - 830MHz | 860MHz - 875MHz | FDD |
| 19 | 830MHz - 845MHz | 875MHz - 890MHz | FDD |
| 20 | 832MHz - 862MHz | 791MHz - 821MHz | FDD |
| 21 | 1447.9MHz - 1462.9MHz | 1495.9MHz - 1510.9MHz | FDD |
| ... | | | |
| 33 | 1900MHz - 1920MHz | 1900MHz - 1920MHz | TDD |
| 34 | 2010MHz - 2025MHz | 2010MHz - 2025MHz | TDD |
| 35 | 1850MHz - 1910MHz | 1850MHz - 1910MHz | TDD |
| 36 | 1930MHz - 1990MHz | 1930MHz - 1990MHz | TDD |
| 37 | 1910MHz - 1930MHz | 1910MHz - 1930MHz | TDD |
| 38 | 2570MHz - 2620MHz | 2570MHz - 2620MHz | TDD |
| 39 | 1880MHz - 1920MHz | 1880MHz - 1920MHz | TDD |
| 40 | 2300MHz - 2400MHz | 2300MHz - 2400MHz | TDD |

RF POWER AMPLIFIER AND OPERATING METHOD THEREOF

CROSS-REFERENCE TO RELATED APPLICATIONS

This is a continuation application of U.S. application Ser. No. 13/705,328, filed Dec. 5, 2012 which claims priority to Japanese Patent Application No. 2011-277953 filed on Dec. 20, 2011, the entire disclosures of all applications listed above are hereby incorporated by reference.

BACKGROUND

The present invention relates to an RF power amplifier and an operating method thereof, and particularly relates to a technology effective for reducing the size of a power detection circuit.

Cell phones, which provide mobile communications, have progressed from the second generation (2G) represented by the GSM standard to the third generation (3G) represented by the W-CDMA and CDMA2000 standards. The cell phones have further progressed to the LTE standard, which is intermediate between the third generation (3G) and the forthcoming fourth generation (4G). GSM is an acronym for Global System for Mobile Communications. W-CDMA is an acronym for Wideband Code Multiplex Access. LTE is an acronym for Long Term Evolution.

The GSM standard, which is the second generation (2G), includes four standards: GSM850, GSM900, DCS1800, and PCS1900. The GSM850, which is widespread mainly in North America, uses radio frequencies (RF) between 824 MHz and 915 MHz for the transmission (uplink) from a cell phone terminal to a base station. The GSM900, which is widespread mainly in Asia, Africa, Oceania, Europe, and Latin America, uses radio frequencies (RF) between 880 MHz and 915 MHz for the transmission (uplink) from a cell phone terminal to a base station. The DCS1800, which is also widespread mainly in Asia, Africa, Oceania, Europe, and Latin America, uses radio frequencies (RF) between 1710 MHz and 1785 MHz for the transmission (uplink) from a cell phone terminal to a base station. The PCS1900, which is widespread mainly in North America and Latin America, uses radio frequencies (RF) between 1850 MHz and 1910 MHz for the transmission (uplink) from a cell phone terminal to a base station. The GSM850 and GSM900 standards are generally called low-band GSM standards, whereas the DCS1800 and PCS1900 standards are generally called high-band GSM standards.

According to technical specifications for the LTE standard, which are prepared by the 3GPP, an extremely large number of frequency bands are available. Typically, band 1, band 2, band 4, band 5, and band 8 are available. For the transmission (uplink) from a band 1 cell phone terminal to a base station, radio frequencies (RF) between 1920 MHz and 1980 MHz are used. For the transmission (uplink) from a band 2 cell phone terminal to a base station, radio frequencies (RF) between 1850 MHz and 1910 MHz are used. For the transmission (uplink) from a band 4 cell phone terminal to a base station, radio frequencies (RF) between 1710 MHz and 1785 MHz are used. For the transmission (uplink) from a band 5 cell phone terminal to a base station, radio frequencies (RF) between 824 MHz and 915 MHz are used. For the transmission (uplink) from a band 8 cell phone terminal to a base station, radio frequencies (RF) between 880 MHz and 915 MHz are used. 3GPP is an acronym for Third Generation Partnership Project.

Meanwhile, using a directional coupler for providing power control of an RF power amplifier is described in "Accurate Power Control Technique for Handset PA Modules with Integrated Directional Couplers" (Jelena Madic et al., 2003 IEEE Radio Frequency Integrated Circuits Symposium, pp. 715-718). According to this document, the power generated from the RF power amplifier is supplied to a main line for a directional coupler. One end of an auxiliary line for the directional coupler is coupled to a ground potential through a terminating resistor. A voltage detected at the other end of the auxiliary line for the directional coupler and a control voltage are supplied to a controller. The RF power amplifier is controlled in accordance with an output from the controller. The detected voltage is determined by adding the vector of a coupled voltage of a traveling-wave signal, which is generated from the RF power amplifier, to the vector of a coupled voltage of a reflected-wave signal, which is reflected from a load.

Further, exercising power control called AC sensing is described in "A VSWR-Protected Silicon Bipolar RF Power Amplifier with Soft-Slope Power Control" (Angelo Scuderi et al., IEEE Journal of Solid-State Circuits, Vol. 40, No. 3, March 2005, pp. 611-621) in addition to using a directional coupler for providing power control of an RF power amplifier, as is the case with "Accurate Power Control Technique for Handset PA Modules with Integrated Directional Couplers" (Jelena Madic et al., 2003 IEEE Radio Frequency Integrated Circuits Symposium, pp. 715-718). In AC sensing, the collector voltage of an output transistor at the final stage of the RF power amplifier is supplied to an input terminal of an envelope detector through a coupling capacitor. An error amplifier compares a voltage detected by the envelope detector to a reference voltage. A driving stage for driving the output transistor at the final stage is controlled in accordance with an output from the error amplifier.

Power control called current sensing is described in U.S. Pat. No. 6,307,364 B1 in addition to power control exercised while a directional coupler formed by a pair of transmission lines is coupled to the collector of an RF amplifying transistor of an RF power amplifier through an output matching circuit. For purposes of current sensing, the base of a small RF signal sensing transistor is coupled to the base of the RF amplifying transistor through two bias resistors. A common bias voltage is supplied to these transistor bases through the two bias resistors. Further, a common RF input signal is supplied through two coupling capacitors. As the element size of the RF signal sensing transistor is set to be physically smaller than that of the RF amplifying transistor, the RF amplification signal of the RF signal sensing transistor is smaller than the RF amplification signal of the RF amplifying transistor.

SUMMARY

Before the disclosure of the present invention, the inventors of the present invention have been engaged in the development of an RF power amplifier that can be mounted in a cell phone terminal capable of establishing wireless communication with a base station in accordance with the LTE standard.

FIG. 5 is a diagram illustrating many frequency bands, uplink frequencies, and downlink frequencies that are described in technical specifications for the LTE standard, which are prepared by the 3GPP.

The uplink frequencies are transmission frequencies that an RF power amplifier in a cell phone terminal uses to transmit data to a base station. The downlink frequencies are reception frequencies that the cell phone terminal uses to receive an RF transmission signal from the base station. The LTE uplink frequencies and downlink frequencies shown in FIG. 5 are characterized in that relatively low RF frequencies of approximately 700 MHz are used in bands 12, 13, 14, and 17 as compared to bands 1, 2, 3, 4, 5, and 8, which have been typically used. The relatively low RF frequencies of approximately 700 MHz are newly allocated in Japan and in the U.S. to the wireless communication of cell phones after the termination of analog television broadcast.

According to studies conducted by the inventors before the disclosure of the present invention, an RF power amplifier mountable in a cell phone terminal capable of permitting the uplink of relatively low RF frequencies of approximately 700 MHz will obviously increase the size of a directional coupler that has been used for the detection of RF transmission power. This size increase will impede the size reduction of the cell phone terminal and RF power amplifier.

In other words, the directional coupler is formed by a pair of transmission lines, namely, a main line and an auxiliary line, as described in U.S. Pat. No. 6,307,364 B1. As is well known, the main line and auxiliary line of the directional coupler are coupled together by a $\lambda/4$ joint, which has a length of $\frac{1}{4}$ wavelength $\lambda$. Therefore, the traveling-wave signal on the main line is transmitted to the auxiliary line. Further, when the traveling-wave signal is transmitted from one end to the other end of the main line, the $\lambda/4$ joint generates a phase difference of 90 degrees between the ends of the main line. Meanwhile, when the reflected-wave signal, which is reflected from a load, is transmitted from one end to the other end of the main line, the $\lambda/4$ joint generates a phase difference of 90 degrees between the ends of the main line. As a result, at one end of the main line traveling-wave signal, the phase difference between the traveling-wave signal and the reflected-wave signal is 180 degrees, that is, the traveling-wave signal and the reflected-wave signal are in opposite phase with each other. It means that the traveling-wave signal and the reflected-wave signal counteract each other. As the reflected-wave signal is lower in magnitude than the traveling-wave signal, the traveling-wave signal whose magnitude is reduced due to signal magnitude subtraction (cancellation) remains at one end of the main line of the directional coupler. The traveling-wave signal, which is reduced in magnitude due to cancellation and remaining at one end of the main line, is then transmitted to the auxiliary line of the directional coupler. This ensures that the traveling-wave signal prevailing after cancellation is unidirectionally transmitted from the main line to the auxiliary line without allowing the reflected-wave signal prevailing after cancellation to be transmitted from the main line to the auxiliary line.

In accordance with the above principles on which the traveling-wave signal is unidirectionally transmitted from the main line to the auxiliary line after the cancellation of the traveling-wave signal and reflected-wave signal at one end of the directional coupler, the detected voltage generated from the auxiliary line for the directional coupler does not contain a reflected-wave signal component but contains a traveling-wave signal component only. Meanwhile, at the cell phone terminal, the load impedance of a load on the RF power amplifier changes due to contact with an antenna's conductive material, thereby changing the magnitude of the reflected-wave signal. However, the detected voltage generated from the auxiliary line for the directional coupler does not substantially contain a reflected-wave signal component as described above. Hence, only the traveling-wave signal component can be accurately indicated. Consequently, the directional coupler used to detect the power of the RF power amplifier can accurately indicate only an RF transmission signal component of the traveling-wave signal directed to the load without containing an error component of the reflected-wave signal from the load.

However, the directional coupler that accurately detects the power of the RF power amplifier requires the $\lambda/4$ joint, which has a length of $\frac{1}{4}$ the wavelength $\lambda$ of the RF transmission signal as described earlier. Therefore, in bands 1, 2, 3, 4, 5, and 8 and other relatively high RF frequency bands, which have been used and are approximately 800 MHz or higher in frequency, the RF transmission signal's wavelength $\lambda$ itself is short. Hence, the size of the directional coupler decreases. Consequently, the cell phone terminal and RF power amplifier can be reduced in size.

On the other hand, in bands 12, 13, 14, and 17 and other relatively low RF frequency bands having frequencies of approximately 700 MHz, the RF transmission signal's wavelength $\lambda$ itself is long. Hence, the size of the directional coupler increases. Consequently, it is obviously difficult to reduce the cell phone terminal and RF power amplifier in size.

Further, as a method of not using the directional coupler for detecting the power of the RF power amplifier, the use of an AC sensing method described in "A VSWR-Protected Silicon Bipolar RF Power Amplifier with Soft-Slope Power Control" (Angelo Scuderi et al., IEEE Journal of Solid-State Circuits, Vol. 40, No. 3, March 2005, pp. 611-621) and the use of a current sensing method described in U.S. Pat. No. 6,307,364 B1 have also been studied by the inventors before the disclosure of the present invention.

However, according to the studies conducted by the inventors before the disclosure of the present invention, the use of the aforementioned AC sensing method will obviously permit the reflected-wave signal component based on load changes to change the collector current of the RF amplifying transistor, thereby changing the base-emitter voltage of the RF amplifying transistor and of the RF signal sensing transistor. This will cause an error in a power detection signal generated from the collector of the RF signal sensing transistor.

Further, according to the studies conducted by the inventors before the disclosure of the present invention, the use of the aforementioned current sensing method will obviously permit a change in the reflected-wave signal component based on load changes to be supplied to the input terminal of the envelope detector through the coupling capacitor. This will cause an error in the voltage detected by the envelope detector.

The present invention has been made as a result of the above studies conducted by the inventors before the disclosure of the present invention.

The present invention has been made in view of the above circumstances to reduce the size of a power detection circuit of an RF power amplifier.

The present invention has also been made to increase the accuracy of the power detection circuit of the RF power amplifier.

The foregoing and other advantages and novel features of the present invention will become apparent from the following detailed description of the present invention and from the accompanying drawings.

Representative aspects of the present invention disclosed in this document are outlined below.

According to a representative aspect of the present invention, there is provided an RF power amplifier that includes an RF amplifier circuit (11) and a power detection circuit (14).

When an RF input signal (Pin) having a predetermined frequency band is supplied to an input terminal of the RF amplifier circuit (11), the RF amplifier circuit (11) subjects the RF input signal to power amplification and generates an RF amplifier output signal (Pout) having the predetermined frequency band from an output terminal of the RF amplifier circuit (11).

An input terminal of the power detection circuit (14) is coupled to the output terminal of the RF amplifier circuit (11). The power detection circuit (14) detects a harmonic component having a harmonic frequency that is a whole number multiple of the frequency of a fundamental wave component of the RF amplifier output signal. In accordance with the detected harmonic component, the power detection circuit (14) generates at an output terminal a detected signal indicative of the signal level of the fundamental wave component of the RF amplifier output signal (see FIG. 1).

An advantage provided by a representative aspect of the present invention is outlined below.

The present invention makes it possible to reduce the size of the power detection circuit of the RF power amplifier.

BRIEF DESCRIPTION OF THE DRAWINGS

FIG. 5 is a diagram illustrating many frequency bands, uplink frequencies, and downlink frequencies that are described in technical specifications for the LTE standard, which are prepared by the 3GPP.

DETAILED DESCRIPTION

1. Overview of Embodiments

Figure 1:
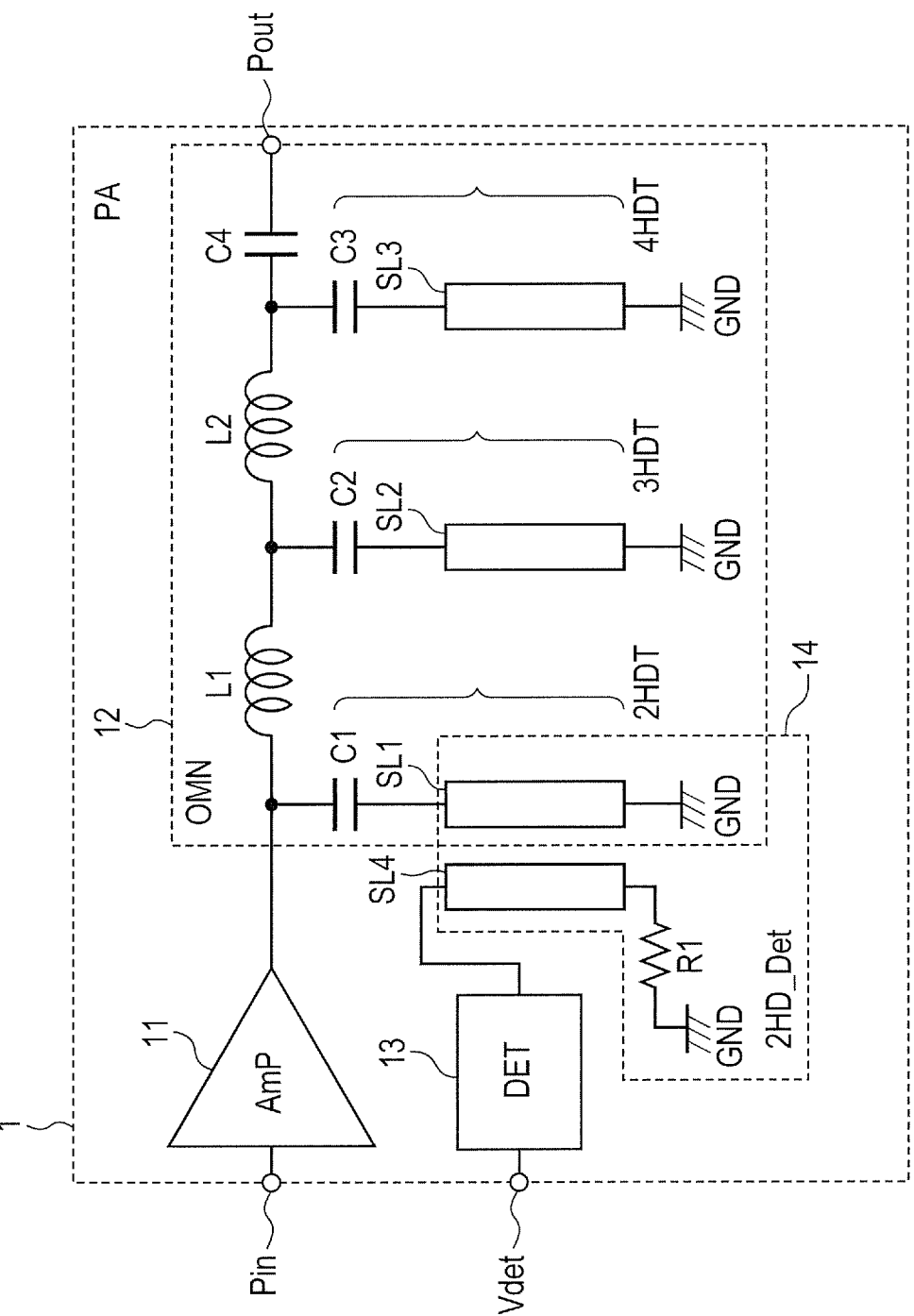
FIG. 1 is a diagram illustrating the configuration of an RF power amplifier 1 according to a first embodiment of the present invention.

First of all, embodiments representative of the present invention disclosed in this document will be summarized. The parenthesized reference numerals in the accompanying drawings referred to in the overview of the representative embodiments merely illustrate what is contained in the concept of elements to which the reference numerals are affixed.

[1] According to a representative embodiment of the present invention, there is provided an RF power amplifier that includes an RF amplifier circuit (11) and a power detection circuit (14).

When an RF input signal (Pin) having a predetermined frequency band is supplied to an input terminal of the RF amplifier circuit (11), the RF amplifier circuit (11) subjects the RF input signal to power amplification and generates an RF amplifier output signal (Pout) having the predetermined frequency band from an output terminal of the RF amplifier circuit (11).

An input terminal of the power detection circuit (14) is coupled to the output terminal of the RF amplifier circuit (11). The power detection circuit (14) detects a harmonic component having a harmonic frequency that is a whole number multiple of the frequency of a fundamental wave component of the RF amplifier output signal. In accordance with the detected harmonic component, the power detection circuit (14) generates at an output terminal a detected signal indicative of the signal level of the fundamental wave component of the RF amplifier output signal (see FIG. 1).

The above-described embodiment makes it possible to reduce the size of the power detection circuit of the RF power amplifier.

In a preferred embodiment, the power detection circuit (14) includes an input circuit (C1, SL1) and an output circuit (SL4, R1). The input circuit (C1, SL1) detects the harmonic component. The output circuit (SL4, R1) generates the detected signal at the output terminal.

The input circuit (C1, SL1) also functions as a harmonic termination circuit (2HDT) that is formed by series-coupling a first inductor (SL1) to a first capacitor (C1), which is coupled between a ground potential (GND) and the output terminal of the RF amplifier circuit (11) (see FIG. 1).

In another preferred embodiment, the output circuit (SL4, R1) includes a second inductor (SL2).

When the second inductor is electromagnetically coupled to the first inductor of the input circuit, the output circuit operates so that the detected signal generated by the second inductor due to the electromagnetic coupling is generated at the output terminal of the power detection circuit (14) (see FIG. 1).

In still another preferred embodiment, the harmonic termination circuit (2HDT), which is formed by the series-coupling, is included in an output matching circuit (12) coupled to the output terminal of the RF amplifier circuit (11) (see FIG.

In a more preferred embodiment, the harmonic termination circuit (2HDT), which is formed by the series-coupling, is coupled between the ground potential (GND) and the input or output terminal of the output matching circuit (12) or an intermediate tap between the input and output terminals (see FIG.

In another more preferred embodiment, one end of the second inductor (SL2) of the output circuit is coupled to the ground potential (GND) through a terminating resistor (R1) so that the detected signal is generated from the other end of the second inductor (SL2) (see FIG. 1).

Figure 3:
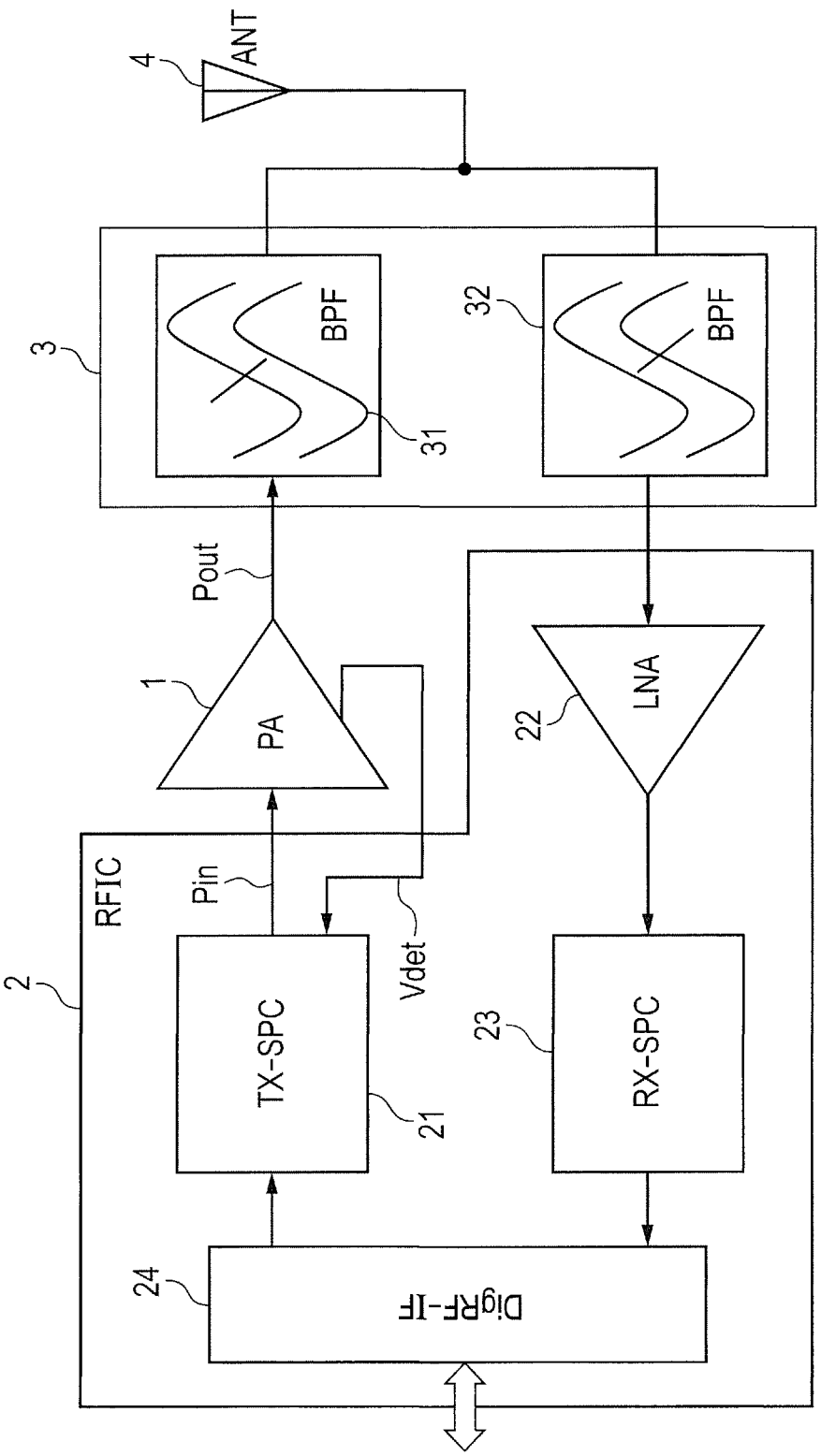
FIG. 3 is a diagram illustrating how the RF power amplifier 1 according to the first embodiment, which is depicted in FIGS. 1 and 2, is mounted in a frequency-division duplex (FDD) cell phone terminal.

In still another more preferred embodiment, the output terminal of the output matching circuit (12) can be coupled to a duplexer (3) that provides frequency-division duplex (FDD) transmission and reception (see FIG. 3).

In yet another more preferred embodiment, the predetermined frequency band of the RF input signal has RF frequencies of approximately 700 MHz.

In a detailed embodiment, the RF frequencies of approximately 700 MHz are the frequencies of LTE band 12, 13, 14, or 17 (see FIG. 1).

Figure 4:
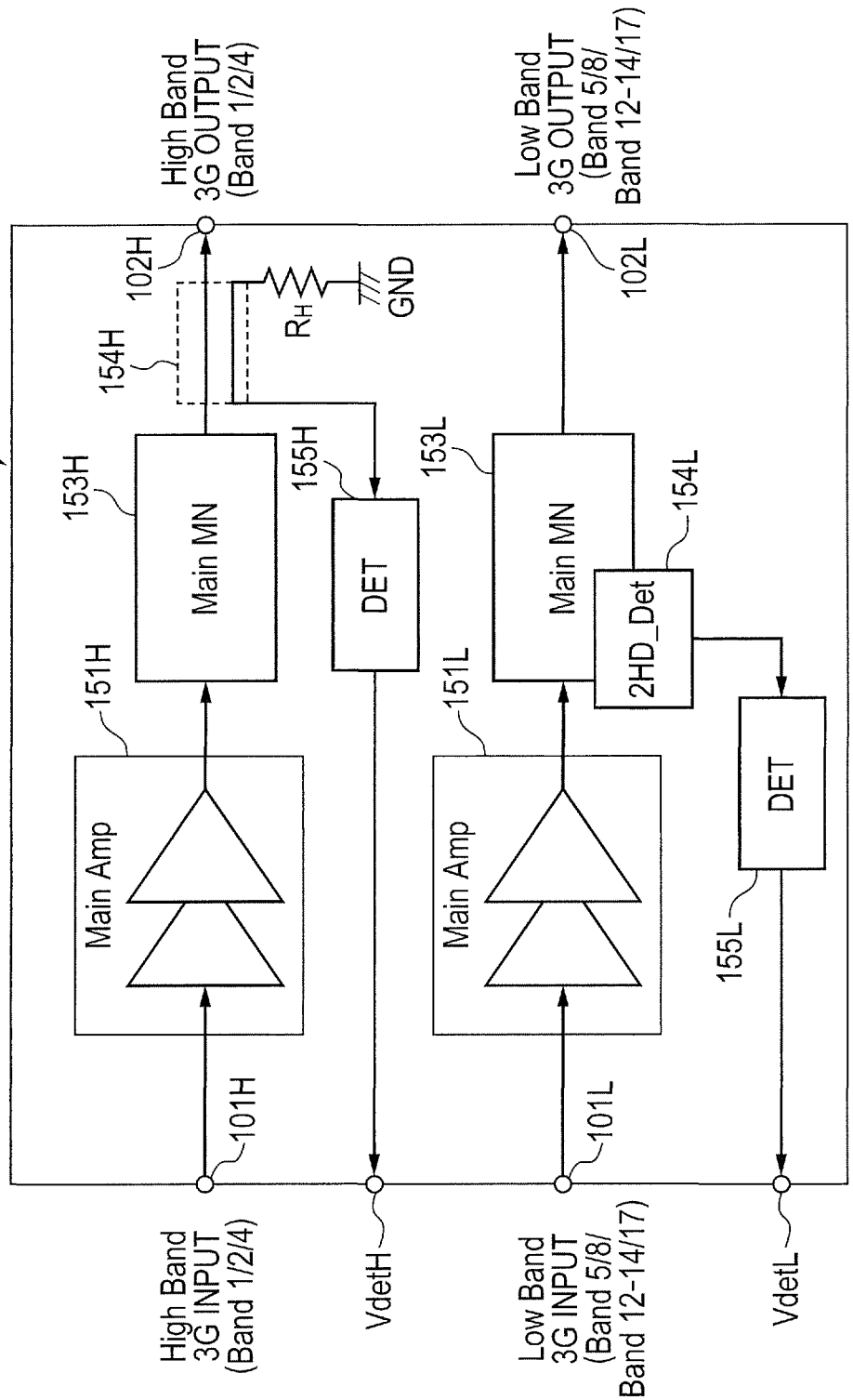
FIG. 4 is a diagram illustrating the configuration of the RF power amplifier 1 according to a second embodiment of the present invention, which achieves dual-band transmission.

In the most detailed embodiment, the RF power amplifier acts as a low-frequency band RF power amplifier in a situation where an RF power amplifier device that provides the transmission of a plurality of frequency bands, such as a high band and a low band, and includes a high-frequency band RF power amplifier, which provides the transmission of the high band, and the low-frequency band RF power amplifier, which provides the transmission of the low band (see FIG. 4).

[2] According to another representative embodiment of the present invention, there is provided a method of operating an RF power amplifier that includes an RF amplifier circuit (11) and a power detection circuit (14).

When an RF input signal (Pin) having a predetermined frequency band is supplied to an input terminal of the RF amplifier circuit (11), the RF amplifier circuit (11) subjects the RF input signal to power amplification and generates an RF amplifier output signal (Pout) having the predetermined frequency band from an output terminal of the RF amplifier circuit (11).

An input terminal of the power detection circuit (14) is coupled to the output terminal of the RF amplifier circuit (11). The power detection circuit (14) detects a harmonic component having a harmonic frequency that is a whole number multiple of the frequency of a fundamental wave component of the RF amplifier output signal. In accordance with the detected harmonic component, the power detection circuit (14) generates at an output terminal a detected signal indicative of the signal level of the fundamental wave component of the RF amplifier output signal (see FIG. 1).

The above-described embodiment makes it possible to reduce the size of the power detection circuit of the RF power amplifier.

2. Details of Embodiments

Embodiments of the present invention will now be described in further detail. Throughout the drawings for illustrating the embodiments, parts having the same functions are designated by the same reference numerals and will not be redundantly described.

First Embodiment

<Configuration of Rf Power Amplifier>

FIG. 1 is a diagram illustrating the configuration of an RF power amplifier 1 according to a first embodiment of the present invention.

The RF power amplifier 1 according to the first embodiment, which is shown in FIG. 1, includes a multistage RF power amplifier circuit (Amp) 11, an output matching circuit (OMN) 12, a detection circuit (DET) 13, and a harmonic detection circuit (2HD_Det) 14.

<Multistage RF Power Amplifier Circuit>

Each power amplifier stage of the multistage RF power amplifier circuit (Amp) 11 includes a LD (Laterally Diffused), source-grounded, N-channel power MOS transistor as a power amplifying element. An RF transmission input signal Pin having a relatively low RF frequency band of approximately 700 MHz, such as bands 12, 13, 14, and 17, is supplied to the gate input electrode of a MOS transistor that acts as an initial-stage amplifying element of an initial power amplifier stage. The drain output electrode of the MOS transistor acting as the initial-stage amplifying element generates an RF initial-stage amplification signal. The RF initial-stage amplification signal having the aforementioned relatively low RF frequency band is supplied through a first interstage matching circuit to the gate input electrode of a MOS transistor that acts as a middle-stage amplifying element of a middle power amplifier stage. The drain output electrode of the MOS transistor acting as the middle-stage amplifying element generates an RF middle-stage amplification signal. The RF middle-stage amplification signal having the aforementioned relatively low RF frequency band is supplied through a second interstage matching circuit to the gate input electrode of a MOS transistor that acts as a final-stage amplifying element of a final power amplifier stage. The drain output electrode of the MOS transistor acting as the final-stage amplifying element generates an RF final-stage amplification signal. The RF final-stage amplification signal is supplied to the input terminal of the output matching circuit (OMN) 12.

<Output Matching Circuit>

(Impedance Conversion by Output Matching Circuit)

The output matching circuit (OMN) 12 has a function of converting a relatively low output impedance of several ohms of the MOS transistor acting as the final-stage amplifying element of the final power amplifier stage of the multistage RF power amplifier circuit (Amp) 11 to an input impedance of 50 ohms of an antenna of a cell phone terminal (not shown). In other words, the output matching circuit (OMN) 12 includes a multistage low-pass filter (LPF) having a plurality of inductors L1, L2 and a plurality of capacitors C1, C2, C3 in order to implement the above-mentioned impedance conversion function. Therefore, the impedance provided by each inductor L1, L2 of the output matching circuit (OMN) 12 moves clockwise along the arc of a constant-resistance circle on the Smith Chart, beginning with the impedance of the input terminal of each inductor. Meanwhile, the impedance provided by each capacitor C1, C2, C3 of the output matching circuit (OMN) 12 moves clockwise along the arc of a constant-conductance circle on the Smith Chart, beginning with the impedance of the input terminal of each capacitor. As all the impedances provided by the inductors L1, L2 and capacitors C1, C2, C3 of the output matching circuit (OMN) 12 move as described above, impedance conversion is eventually performed from a relatively low output impedance of several ohms of the MOS transistor acting as the final-stage amplifying element to an input impedance of 50 ohms of the cell phone terminal's antenna.

(Harmonic Bypass of Output Matching Circuit)

Further, the output matching circuit (OMN) 12 has not only a function of passing the fundamental frequency component of the aforementioned relatively low RF frequency band of approximately 700 MHz, such as bands 12, 13, 14, and 17, but also a function of bypassing the harmonic component of the fundamental frequency component to a ground potential GND. The harmonic component includes, for example, a second-order harmonic component having a frequency two times a fundamental frequency, a third-order harmonic component having a frequency three times the fundamental frequency, and a fourth-order harmonic component having a frequency four times the fundamental frequency.

In addition, the output matching circuit (OMN) 12 has a harmonic termination function of terminating the harmonic component of the fundamental frequency component of the aforementioned relatively low RF frequency band of approximately 700 MHz, such as bands 12, 13, 14, and 17, to the ground potential GND at a low impedance. In other words, the output matching circuit (OMN) 12 includes a plurality of strip lines SL1, SL2, SL3, which function as a plurality of inductors, in order to implement the above-mentioned harmonic termination function.

First of all, the input terminal of the output matching circuit (OMN) 12 is coupled to the ground potential GND through a second-order harmonic component termination circuit 2HDT, which is formed by the capacitor C1 and the strip line SL1. A series resonant frequency, which is determined by the capacitance of the capacitor C1 and the inductance of the strip line SL1, is set to the frequency of a second-order harmonic component having a frequency two times the frequencies of the aforementioned relatively low RF frequency band of approximately 700 MHz, such as bands 12, 13, 14, and 17. As a result, the second-order harmonic component at the input terminal of the output matching circuit (OMN) 12 is bypassed to the ground potential GND by an impedance of approximately zero ohms of the series resonant frequency of a series resonance circuit formed by the capacitor C1 and the strip line SL1. This makes it possible to reduce the amount of detrimental interference wave component in wireless communications.

Next, an intermediate tap between the input and output terminals of the output matching circuit (OMN) 12 is coupled to the ground potential GND through a third-order harmonic component termination circuit 3HDT, which is formed by the capacitor C2 and the strip line SL2. The series resonant frequency, which is determined by the capacitance of the capacitor C2 and the inductance of the strip line SL2, is set to the frequency of a third-order harmonic component having a frequency three times the frequencies of the aforementioned relatively low RF frequency band of approximately 700 MHz, such as bands 12, 13, 14, and 17. Therefore, the third-order harmonic component at the intermediate tap of the output matching circuit (OMN) 12 is bypassed to the ground potential GND by an impedance of approximately zero ohms of the series resonant frequency of a series resonance circuit formed by the capacitor C2 and the strip line SL2. This makes it possible to reduce the amount of detrimental interference wave component in wireless communications.

Further, the output terminal of the output matching circuit (OMN) 12 is coupled to the ground potential GND through a fourth-order harmonic component termination circuit 4HDT, which is formed by the capacitor C3 and the strip line SL3. The series resonant frequency, which is determined by the capacitance of the capacitor C3 and the inductance of the strip line SL3, is set to the frequency of a fourth-order harmonic component having a frequency four times the frequencies of the aforementioned relatively low RF frequency band of approximately 700 MHz, such as bands 12, 13, 14, and 17. As a result, the fourth-order harmonic component at the output terminal of the output matching circuit (OMN) 12 is bypassed to the ground potential GND by an impedance of approximately zero ohms of the series resonant frequency of a series resonance circuit formed by the capacitor C3 and the strip line SL3. This makes it possible to reduce the amount of detrimental interference wave component in wireless communications.

The capacitor C4, which is coupled to the output terminal of the output matching circuit (OMN) 12, not only prevents an output DC voltage of the final power amplifier stage of the multistage RF power amplifier circuit (Amp) 11 from being supplied to a transmission antenna of the cell phone terminal, but also functions as a coupling capacitor for supplying the RF final-stage amplification signal of the final power amplifier stage of the multistage RF power amplifier circuit (Amp) 11 to the transmission antenna of the cell phone terminal. The RF amplifier output signal Pout to be supplied to the transmission antenna is generated through the capacitor C4 of the output matching circuit (OMN) 12.

<Harmonic Detection Circuit>

The harmonic detection circuit (2HD_Det) 14 included in the RF power amplifier 1 according to the first embodiment, which is shown in FIG. 1, is formed by a power combiner. The power combiner includes a strip line SL4 and a terminating resistor R1. The strip line SL4 is electromagnetically coupled to the aforementioned strip line SL1 of the second-order harmonic component termination circuit 2HDT of the output matching circuit (OMN) 12. The terminating resistor R1 is coupled between one end of the strip line SL4 and the ground potential GND. Only a second-order harmonic component having a frequency equal to the series resonant frequency determined by the capacitance of the capacitor C1 and the inductance of the strip line SL1 is applied to the strip line SL1 of the second-order harmonic component termination circuit 2HDT of the output matching circuit (OMN) 12, which functions as an input circuit for the power combiner acting as the harmonic detection circuit (2HD_Det) 14. The other frequency components are not substantially applied.

As a result, only a coupled harmonic component derived from the electromagnetic coupling of the second-order harmonic component applied to the strip line SL1, which functions as an input circuit for the aforementioned power combiner, is applied to a series coupling between the terminating resistor R1 and the strip line SL4, which functions as an output circuit for the power combiner acting as the harmonic detection circuit (2HD_Det) 14 shown in FIG. 1. Consequently, a harmonic detection signal for a coupled second-order harmonic component derived from the electromagnetic coupling of the second-order harmonic component by the power combiner is generated at the other end of the strip line SL4 of the harmonic detection circuit (2HD_Det) 14.

When the harmonic detection signal for the coupled second-order harmonic component is supplied to the input terminal of the detection circuit (DET) 13, a detected voltage Vdet for controlling the transmission power of the RF amplifier output signal of the multistage RF power amplifier circuit (Amp) 11 is generated from the output terminal of the detection circuit (DET) 13.

In the power combiner for the harmonic detection circuit (2HD_Det) 14 shown in FIG. 1, one end of the strip line SL4 is coupled to the ground potential GND through the terminating resistor R1. Therefore, the power combiner functions as a directional coupler. In other words, the power combiner generates the harmonic detection signal for the coupled second-order harmonic component derived from the electromagnetic coupling of the second-order harmonic component in response only to the second-order harmonic component that flows into the strip line SL1 through the capacitor C1 from the output terminal of the multistage RF power amplifier circuit (Amp) 11. Hence, the power combiner does not respond to the second-order harmonic component flowing out of the strip line SL1 through the capacitor C1 toward the output terminal of the multistage RF power amplifier circuit (Amp) 11, and does not generate the harmonic detection signal for the coupled second-order harmonic component derived from the electromagnetic coupling of the second-order harmonic component.

The output voltage y(t) of a harmonic signal generated by the final-stage amplifying element of the multistage RF power amplifier circuit (Amp) 11 is generally given by Equation (1) below when the input voltage for the final-stage amplifying element is $V_1$.

$$y(t) = \left(c_0 + \frac{1}{2}c_2 V_1^2 + \frac{3}{8}c_4 V_1^4\right) + \left(c_1 V_1 + \frac{3}{4}c_3 V_1^3\right)\cos(\omega_1 t + \phi_1) + \\ \left(\frac{1}{2}c_2 V_1^2 + \frac{1}{2}c_4 V_1^4\right)\cos[2(\omega_1 t + \phi_1)] + \\ \left(\frac{1}{4}c_3 V_1^3\right)\cos[3(\omega_1 t + \phi_1)] + \\ \left(\frac{1}{8}c_4 V_1^4\right)\cos[4(\omega_1 t + \phi_1)] + \ldots$$

Equation (1)

In Equation (1) above, the first term represents a DC component; the second term, a fundamental wave transmission signal component; the third term, a second-order harmonic signal component having a frequency two times the frequency of a fundamental wave transmission signal; the fourth term, a third-order harmonic signal component having a frequency three times the frequency of the fundamental wave transmission signal; and the fifth term, a fourth-order harmonic signal component having a frequency four times the frequency of the fundamental wave transmission signal.

It is obvious from Equation (1) that the fundamental wave transmission signal component represented by the second term, the second-order harmonic signal component represented by the third term, the third-order harmonic signal component represented by the fourth term, and the fourth-order harmonic signal component represented by the fifth term monotonically increase with an increase in the input voltage $V_1$ of the final-stage amplifying element. Consequently, even if the harmonic detection circuit (2HD_Det) 14 and detection circuit (DET) 13 in the RF power amplifier 1 according to the first embodiment, which is shown in FIG. 1, detect the second-order harmonic signal component and output it in the form of the detected voltage Vdet, it is possible to detect the power of and provide power control of the fundamental wave transmission signal of the transmission power of the RF amplifier output signal Pout generated from the output terminal of the RF power amplifier 1.

A coefficient $C_k$ in Equation (1) is given by Equation (2) below.

$$c_k = \frac{1}{k!}\left[\frac{d^k f_{nonlinear}(x)}{dx^k}\right]_{x=x_0} \quad \text{Equation (2)}$$

A function $f_{nonlinear}$ (x) in Equation (2) above is given by Equation (3) below.

$$f_{nonlinear}(x) = \sum_{k=0}^{n} c_k(x-x_0)^k \quad \text{Equation (3)}$$

<Power Detection Circuit Size Reduction>

The RF power amplifier according to the first embodiment, which is shown in FIG. 1, is configured so that the detection of the power of the RF amplifier output signal Pout is not based on the detection of the fundamental wave transmission signal component of the RF amplifier output signal Pout, but is based on the detection of the second-order harmonic signal component having a frequency two times the frequency of the fundamental wave transmission signal. Therefore, the wavelength λ of the λ/4 joint of the strip lines SL1, SL4, which respectively function as the input and output circuits of the power combiner of the harmonic detection circuit (2HD_Det) 14 shown in FIG. 1 can be reduced by half to the wavelength of the second-order harmonic signal having a frequency two times the frequency of the fundamental wave transmission signal instead of the wavelength of the fundamental wave transmission signal of the RF amplifier output signal Pout. Consequently, the RF power amplifier 1 according to the first embodiment, which is shown in FIG. 1, makes it possible to reduce the size of the power detection circuit of the RF power amplifier.

<Power Detection Circuit Accuracy Enhancement>

As described earlier, the RF power amplifier 1 according to the first embodiment, which is shown in FIG. 1, is configured so that the output matching circuit (OMN) 12 includes the multistage low-pass filter (LPF), which is formed by the inductors L1, L2 and the capacitors C1, C2, C3 to provide impedance conversion between a low output impedance of several ohms of the final-stage amplifying element of the multistage RF power amplifier circuit (Amp) 11 and a high input impedance of 50 ohms of the cell phone terminal's antenna. Meanwhile, when changes in the load impedance of the RF power amplifier and changes in the magnitude of a reflected-wave signal from a load are caused by the antenna brought into contact with a conductive material, the multistage low-pass filter (LPF) in the output matching circuit (OMN) 12 can bypass the components of the aforementioned second-order, third-order, and fourth-order harmonic signals to the ground potential GND.

Therefore, even when the reflected-wave signal from the antenna is increased due to antenna load changes at the output terminal of the output matching circuit (OMN) 12, a large portion of the harmonic signal components is bypassed to the ground potential GND by the low-pass filter (LPF) during a reflected-wave signal transmission from the output terminal of the output matching circuit (OMN) 12 to the input terminal thereof because the harmonic detection circuit (2HD_Det) 14 is coupled to the input terminal of the output matching circuit (OMN) 12.

As a result, the components of the second-order and other harmonic signals in the reflected-wave signal transmitted to the input terminal of the harmonic detection circuit (2HD_Det) 14 coupled to the input terminal of the output matching circuit (OMN) 12 are reduced by the low-pass filter (LPF). This makes it possible to reduce the influence of a harmonic signal component of the reflected-wave signal contained in the detected voltage Vdet of the second-order harmonic signal component, which is generated by the harmonic detection circuit (2HD_Det) 14 and the detection circuit (DET) 13. Consequently, the RF power amplifier 1 according to the first embodiment, which is shown in FIG. 1, can increase the accuracy of the power detection circuit.

<Power Control Exercised by Using Variable Gain Amplifier and Error Amplifier>

Figure 2:
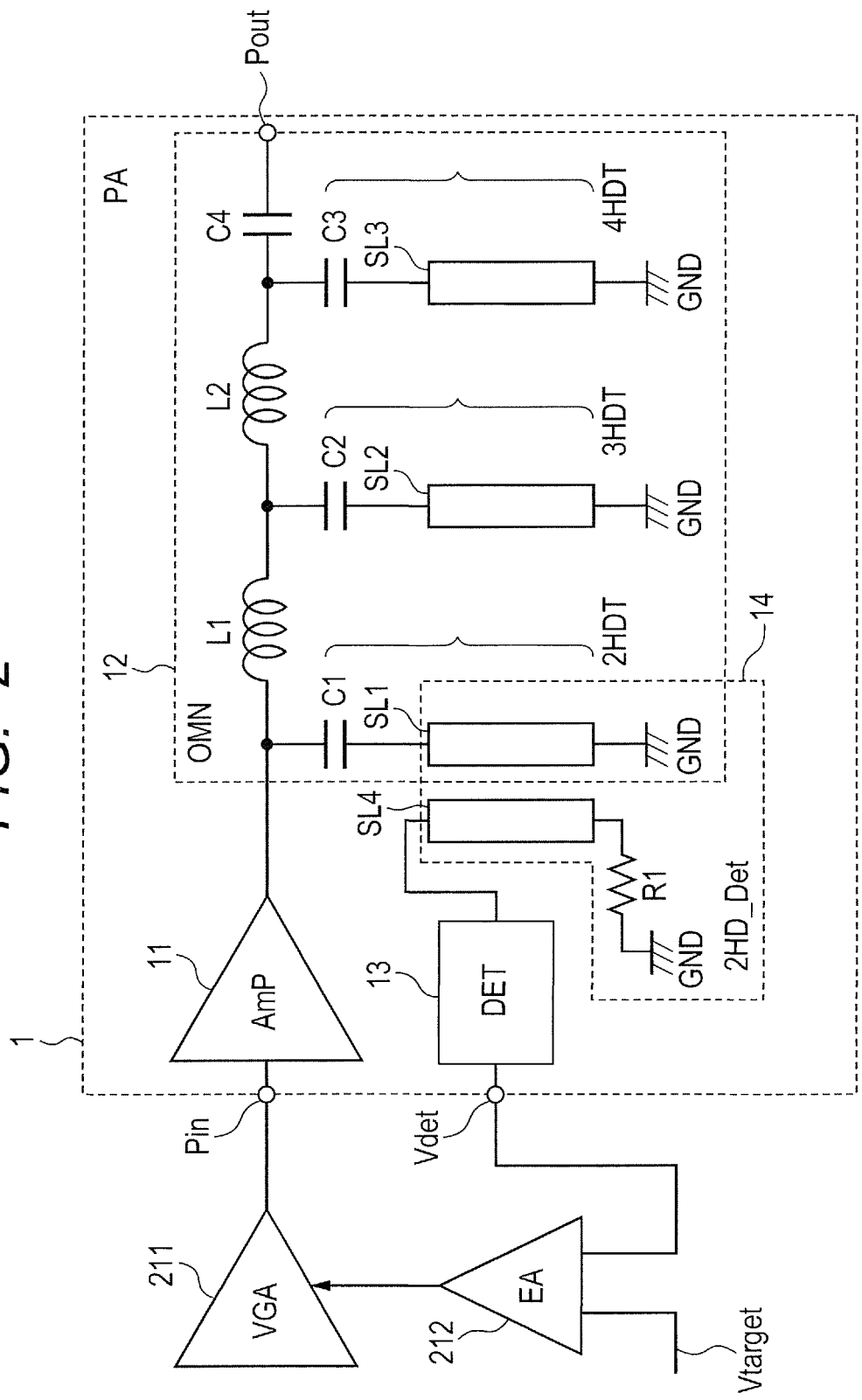
FIG. 2 is a diagram illustrating how a variable gain amplifier (VGA) 211 and an error amplifier (EA) 212 are coupled to the RF power amplifier 1 in order to control the transmission power of an RF amplifier output signal Pout generated from an output terminal of the RF power amplifier 1 according to the first embodiment, which is depicted in FIG. 1.

FIG. 2 is a diagram illustrating how a variable gain amplifier (VGA) 211 and an error amplifier (EA) 212 are coupled to the RF power amplifier 1 in order to control the transmission power of the RF amplifier output signal Pout generated from the output terminal of the RF power amplifier 1 according to the first embodiment, which is depicted in FIG. 1.

As shown in FIG. 2, the RF transmission input signal Pin generated from the output terminal of the variable gain amplifier (VGA) 211 is supplied to an RF input terminal of the multistage RF power amplifier circuit (Amp) 11 in the RF power amplifier 1.

Although not shown in FIG. 2, an RF transmission signal generated by an upconverter in a transmission signal processing circuit (TX-SPC) of a radio-frequency integrated circuit (RFIC) mounted in the cell phone terminal is supplied to the input terminal of the variable gain amplifier (VGA) 211.

Further, as shown in FIG. 2, a reference voltage Vtarget, which corresponds to a transmission target power, and the detected voltage Vdet of the second-order harmonic signal, which is generated by the harmonic detection circuit (2HD_Det) 14 and the detection circuit (DET) 13, are respectively supplied to one input terminal of the error amplifier (EA) 212 and to the other input terminal thereof so that the output signal of the error amplifier (EA) 212 controls the variable gain of the variable gain amplifier (VGA) 211.

When control is to be exercised so that the transmission power of the RF amplifier output signal Pout generated from the output terminal of the RF power amplifier 1 is maintained at a high level, the reference voltage Vtarget at a relatively high level is supplied to one input terminal of the error amplifier (EA) 212. If the transmission power of the RF amplifier output signal Pout does not increase to the target power in response to the reference voltage Vtarget at the relatively high level, the detected voltage Vdet of the second-order harmonic signal, which is supplied to the other input terminal of the error amplifier (EA) 212, is lower than the reference voltage Vtarget so that the output signal of the error amplifier (EA) 212 increases the variable gain of the variable gain amplifier (VGA) 211. In other words, a feedback loop for the detected voltage Vdet increases the variable gain of the variable gain amplifier (VGA) 211 and the transmission power of the RF amplifier output signal Pout until the detected voltage Vdet agrees with the reference voltage Vtarget.

<Mounting of RF Power Amplifier in Cell Phone Terminal>

FIG. 3 is a diagram illustrating how the RF power amplifier 1 according to the first embodiment, which is depicted in FIGS. 1 and 2, is mounted in a frequency-division duplex (FDD) cell phone terminal.

As shown in FIG. 3, the frequency-division duplex (FDD) cell phone terminal includes the RF power amplifier 1 according to the first embodiment, which is depicted in FIGS. 1 and 2, a radio-frequency signal processing integrated circuit (RFIC) 2, a duplexer 3, and an antenna (ANT) 4.

<Duplexer>

The second generation (2G) GSM standards, namely, the GSM850, GSM900, DCS1800, and PCS1900 standards, use a time-division duplex (TDD) method in which a transmission operation and a reception operation are time-divided. On the other hand, the third generation (3G) standards, such as the W-CDMA standard, and the LTE standard use a frequency-division duplex (FDD) method in which a transmission operation and a reception operation are frequency-divided.

In order to implement the frequency-division duplex (FDD) method in the cell phone terminal shown in FIG. 3, the reception frequency band of a reception filter 32 in the duplexer 3 is set to be different from the transmission frequency band of a transmission filter 31 in the duplexer 3.

<Rfic>

The radio-frequency signal processing integrated circuit (RFIC) 2 includes a transmission signal processing circuit (TX-SPC) 21, a low-noise amplifier (LNA) 22, a reception signal processing circuit (RX-SPC) 23, and a digital interface (DigRF-IF) 24. A baseband signal processing unit (not shown) supplies a transmission baseband digital signal to the digital interface (DigRF-IF) 24. The digital interface (DigRF-IF) 24 supplies a reception baseband digital signal to the baseband signal processing unit (not shown). It should be noted that the transmission signal processing circuit (TX-SPC) 21 includes the variable gain amplifier (VGA) 211 and the error amplifier (EA) 212, which have been described with reference to FIG. 2.

The transmission baseband digital signal from the digital interface (DigRF-IF) 24 is converted to a transmission baseband analog signal by a digital-to-analog converter (DAC) in the transmission signal processing circuit (TX-SPC) 21. The transmission baseband analog signal is converted to a transmission RF signal by the upconverter in the transmission signal processing circuit (TX-SPC) 21. The transmission RF signal generated from the transmission signal processing circuit (TX-SPC) 21 is supplied to an RF signal input terminal of the RF power amplifier 1 according to the first embodiment, which is shown in FIGS. 1 and 2.

A transmission RF power amplifier signal Pout generated from an RF signal output terminal of the RF power amplifier 1 is supplied to the antenna (ANT) 4 through the transmission filter 31 in the duplexer 3. This causes the antenna (ANT) 4 to transmit a transmission wave to a base station.

A reception RF signal from the base station, which is received by the antenna (ANT) 4, is supplied to the input terminal of the low-noise amplifier (LNA) 22 in the radio-frequency signal processing integrated circuit (RFIC) 2 through the reception filter 32 in the duplexer 3.

Consequently, the reception RF amplifier signal generated from the output terminal of the low-noise amplifier (LNA) 22 is converted to a reception baseband analog signal by a down-converter in the reception signal processing circuit (RX-SPC) 23. The reception baseband analog signal is converted to a reception baseband digital signal by an analog-to-digital converter (ADC) in the reception signal processing circuit (RX-SPC) 23. The reception baseband digital signal is supplied to the baseband signal processing unit (not shown) through the digital interface (DigRF-IF) 24.

<RF Power Amplifier Coupled to Duplexer>

When an RF output terminal of the RF power amplifier 1 according to the first embodiment, which is shown in FIGS. 1 and 2, is coupled to the duplexer 3 as shown in FIG. 3 to implement the frequency-division duplex (FDD) method, remarkable advantages are obtained as described below.

As mentioned earlier, in order to implement the frequency-division duplex (FDD) method, the reception frequency band of the reception filter 32 in the duplexer 3 is set to be different from the transmission frequency band of the transmission filter 31 in the duplexer 3. Particularly, the transmission filter 31 in the duplexer 3 is a bandpass filter (BPF) that allows frequencies in the transmission frequency band to pass while attenuating to a certain extent frequencies lower than those in the transmission frequency band and frequencies higher than those in the transmission frequency band. In other words, the transmission filter 21 in the duplexer, which is formed by a bandpass filter (BPF), allows a fundamental wave transmission signal in the transmission frequency band to pass, but suppresses harmonic components such as a second-order harmonic signal having a frequency two times the frequency of the fundamental wave transmission signal and a third-order harmonic signal having a frequency three times the frequency of the fundamental wave transmission signal.

Therefore, in the cell phone terminal shown in FIG. 3, even when an RF transmission output signal Pout of the RF power amplifier 1 is reflected between the transmission filter 31 in the duplexer 3 and the antenna (ANT) 4, it is just that the frequency component of the fundamental wave transmission signal of the RF transmission output signal Pout is reflected. As a harmonic component having a frequency that is a whole number multiple of a fundamental wave frequency is not substantially output from the transmission filter 31 to the antenna (ANT) 4, the reflection of the harmonic component can be ignored. Consequently, in the RF power amplifier 1 according to the first embodiment, which is shown in FIGS. 1 and 2 and coupled to the transmission filter 31 in the duplexer 3 as shown in FIG. 3, the functionality of the duplexer 3 can reduce the influence of a harmonic signal component of the reflected-wave signal contained in the detected voltage Vdet of the second-order harmonic signal component, which is generated by the harmonic detection circuit (2HD_Det) 14 and the detection circuit (DET) 13.

In the output matching circuit (OMN) 12 shown in FIG. 1, the second-order harmonic component termination circuit 2HDT, the third-order harmonic component termination circuit 3HDT, and the fourth-order harmonic component termination circuit 4HDT need not always be sequentially coupled in order named to the input terminal, intermediate tap, and output terminal of the output matching circuit (OMN) 12.

When, for instance, the intended purpose is to merely reduce the size of the power detection circuit, a random order of the harmonic component termination circuits may be used instead of the order shown in FIG. 1. More specifically, an alternative is to sequentially couple the fourth-order harmonic component termination circuit 4HDT, the second-order harmonic component termination circuit 2HDT, and the third-order harmonic component termination circuit 3HDT in order named or sequentially couple the third-order harmonic component termination circuit 3HDT, the fourth-order harmonic component termination circuit 4HDT, and the second-order harmonic component termination circuit 2HDT in order named.

Further, when the duplexer 3 shown in FIG. 3 is used in a situation where the intended purpose is to reduce the size of and increase the accuracy of the power detection circuit, the duplexer 3 functions to reduce the influence of a harmonic signal component of the reflected-wave signal contained in the detected voltage Vdet of the second-order harmonic signal component. Therefore, the harmonic component termination circuits can be coupled to the input terminal, intermediate tap, and output terminal of the output matching circuit (OMN) 12 in a perfectly random order, as is the case with the aforementioned purpose.

Furthermore, when the duplexer 3 shown in FIG. 3 is not used in a situation where the intended purpose is to reduce the size of and increase the accuracy of the power detection circuit, the harmonic detection circuit (2HD_Det) 14 can be coupled to the input terminal, intermediate tap, or output terminal of the output matching circuit (OMN) 12. If the harmonic detection circuit (2HD_Det) 14 is coupled to the output terminal of the output matching circuit (OMN) 12, the detected voltage Vdet of the second-order harmonic signal component, which is generated by the harmonic detection circuit (2HD_Det) 14 and the detection circuit (DET) 13, contains the influence of a harmonic signal component of the reflected-wave signal at a high signal level.

Moreover, in the harmonic detection circuit (2HD_Det) 14 shown in FIG. 1, one end of the strip line SL4 of the power combiner is not always coupled to the ground potential GND through the terminating resistor R1. For example, one end of the strip line SL4 of the power combiner can be coupled directly to the ground potential GND, bypassing the terminating resistor R1. This ensures that the power combiner functions as a non-directional coupler, which does not have earlier-described unidirectionality. Hence, this non-directional coupler generates the harmonic detection signal for the coupled second-order harmonic component derived from the electromagnetic coupling of the second-order harmonic component in response to the second-order harmonic component flowing into the strip line SL1 through the capacitor C1 and to the second-order harmonic component flowing out of the strip line SL1 through the capacitor C1.

Second Embodiment

<Configuration of RF Power Amplifier Capable of Achieving Dual-Band Transmission>

FIG. 4 is a diagram illustrating the configuration of the RF power amplifier 1 according to a second embodiment of the present invention, which achieves dual-band transmission.

The RF power amplifier 1 according to the second embodiment, which is shown in FIG. 4, includes a high-band multistage amplifier circuit 151H, a high-band output matching circuit 153H, a high-band directional coupler 154H, a high-band detection circuit 155H, a terminating resistor R1, a low-band multistage amplifier circuit 151L, a low-band output matching circuit 153L, a low-band harmonic detection circuit (2HD_Det) 154L, and a low-band detection circuit 155L.

The transmission signal processing circuit (TX-SPC) in the radio-frequency integrated circuit (RFIC) (not shown) supplies high-band RF transmission signals of aforementioned band 1, band 2, and band 4 to a high-band input terminal 101H. As shown in FIG. 5, the uplink frequencies of bands 1, 2, and 4 respectively range from 1920 MHz to 1980 MHz, from 1850 MHz to 1910 MHz, and from 1710 MHz to 1755 MHz.

The high-band RF transmission signals of bands 1, 2, and 4, which are supplied to the high-band input terminal 101H, are amplified by the high-band multistage amplifier circuit 151H. A high-band RF transmission amplified output signal generated by the high-band multistage amplifier circuit 151H is supplied to the input terminal of the high-band output matching circuit 153H, which is formed by the multistage low-pass filter (LPF) as described earlier. The high-band RF transmission amplified output signal at the output terminal of the high-band output matching circuit 153H is supplied to a high-band output terminal 102H through a main line of the high-band directional coupler 154H.

One end of an auxiliary line of the high-band directional coupler 154H is coupled to the ground potential GND through a terminating resistor $R_H$. A high-band detection signal is supplied from the other end of the auxiliary line to the input terminal of the high-band detection circuit 155H. A high-band detected voltage VdetH is generated from the output terminal of the high-band detection circuit 155H.

A $\lambda/4$ joint, which has a length of ¼ the wavelength $\lambda$ of the aforementioned high-band RF transmission signals, is used to couple the main line of the high-band directional coupler 154H to the auxiliary line thereof. Therefore, the traveling-wave signal on the main line is transmitted to the auxiliary line. As the frequencies of the aforementioned high-band RF transmission signals of bands 1, 2, and 4 are at least as high as 1710 MHz, the length of ¼ the wavelength $\lambda$ of the high-band RF transmission signals is short so that the lengths of the main line and auxiliary line of the high-band directional coupler 154H, which are coupled together by the $\lambda/4$ joint, are short as well. Consequently, the size of the high-band directional coupler 154H can be reduced. The high-band RF transmission amplified output signal generated from the high-band output terminal 102H is supplied to a transmission filter in a high-band duplexer (not shown). Further, as the high-band directional coupler 154H is used for high-band power detection, an error, for instance, in a reflected wave of the high-band detected voltage VdetH at the output terminal of the high-band detection circuit 155H is reduced. This makes it possible to provide high-band power detection and power control with high accuracy.

The transmission signal processing circuit (TX-SPC) in the radio-frequency integrated circuit (RFIC) (not shown) supplies low-band RF transmission signals of aforementioned bands 5, 8, 12, 13, 14, and 17 to a low-band input terminal 101L. As shown in FIG. 5, the uplink frequencies of bands 5, 8, 12, 13, 14, and 17 respectively range from 824 MHz to 849 MHz, from 880 MHz to 915 MHz, from 698 MHz to 716 MHz, from 777 MHz to 787 MHz, from 788 MHz to 798 MHz, and from 704 MHz to 798 MHz.

The low-band RF transmission signals of bands 5, 8, 12, 13, 14, and 17, which are supplied to the low-band input terminal 101L, are amplified by the low-band multistage amplifier circuit 151L. A low-band RF transmission amplified output signal generated by the low-band multistage amplifier circuit 151L is supplied to the input terminal of the low-band output matching circuit 153L and to the input terminal of the low-band harmonic detection circuit (2HD_Det) 154L. A signal output from the low-band harmonic detection circuit (2HD_Det) 154L is supplied to the input terminal of the low-band detection circuit 155L so that a low-band detected voltage VdetL is generated from the output terminal of the low-band detection circuit 155L. Further, the low-band RF transmission amplified output signal generated from a low-band output terminal 102L is supplied to a transmission filter in a low-band duplexer (not shown).

The low-band output matching circuit 153L, low-band harmonic detection circuit (2HD_Det) 154L, and low-band detection circuit 155L included in the RF power amplifier 1 according to the second embodiment, which is shown in FIG. 4, respectively have the same configuration as the output matching circuit (OMN) 12, harmonic detection circuit (2HD_Det) 14, and detection circuit (DET) 13 included in the RF power amplifier 1 according to the first embodiment, which is shown in FIGS. 1 and 2. Consequently, the RF power amplifier 1 according to the second embodiment, which is shown in FIG. 4, makes it possible to reduce the size of and increase the accuracy of a low-band power detection circuit.

While the present invention contemplated by its inventors has been described in detail in terms of preferred embodiments, it is to be understood that the present invention is not limited to those preferred embodiments, but extends to various modifications that nevertheless fall within the scope of the appended claims.

For example, the amplifying element of the RF amplifier circuit is not limited to a LD, source-grounded, N-channel power MOS transistor. For example, an emitter-grounded heterojunction bipolar transistor based on a compound semiconductor such as GaAs or a MESFET based on a chemical semiconductor such as GaAs may also be used.

Further, if the harmonic detection circuit (2HD_Det) 14 supplies, for example, the third-order or fourth-order harmonic component instead of the second-order harmonic component, the power detection circuit can be further reduced in size.

Moreover, the present invention is also applicable to a dual-band RF power amplifier mounted in a second-generation (2G) GSM cell phone terminal compliant with the GSM850, GSM900, DCS1800, or PCS1900 standard. In other words, the present invention can be applied to power detection and power control of the low band of GSM850 or GSM900.

When such power control is to be exercised, the variable-gain amplifier (VGA) 211 coupled to the RF power amplifier 1 is not used as shown in FIG. 2. Instead, the output signal of the variable-gain amplifier (VGA) 211 is used to provide variable control of the amplifier gain of the multistage RF power amplifier circuit (Amp) 11. More specifically, the output signal of the variable-gain amplifier (VGA) 211 is used to provide variable control of the gate bias voltage or base bias voltage of the multistage RF power amplifier circuit (Amp) 11 or provide variable control of the drain power supply voltage or collector power supply voltage of the multistage RF power amplifier circuit (Amp) 11.

What is claimed is:

1. A RF power amplifier comprising:
   a first band RF amplifier circuit to amplify a first frequency band;
   a second band RF amplifier circuit to amplify a second frequency band; and
   a second band power detection circuit,
   wherein, when an RF input signal having the second frequency band is supplied to an input terminal of the second band RF amplifier circuit, the second band RF amplifier circuit subjects the RF input signal to power amplification and generates an RF amplifier output signal having the second frequency band from an output terminal of the second band RF amplifier circuit,
   wherein an input terminal of the second band power detection circuit is coupled to the output terminal of the second band RF amplifier circuit,
   wherein the second band power detection circuit detects a harmonic component that is a whole number multiple of a fundamental wave component of the RF amplifier output signal, and, in accordance with the detected harmonic component, generates, at an output terminal thereof, a detected signal indicative of the signal level of the fundamental wave component of the RF amplifier output signal, and
   wherein the second band power detection circuit includes an input circuit, which detects the harmonic component, and the input circuit also functions as a harmonic termination circuit that is formed by series-coupling a first inductor to a first capacitor, which is coupled between a ground potential and the output terminal of the second band RF amplifier circuit.

2. The RF power amplifier according to claim 1,
   wherein the second band power detection circuit includes an output circuit, which generates the detected signal at the output terminal.

3. The RF power amplifier according to claim 2,
   wherein the output circuit includes a second inductor, and
   wherein, when the second inductor is electromagnetically coupled to the first inductor of the input circuit, the output circuit operates so that the detected signal generated by the second inductor due to the electromagnetic coupling is generated at the output terminal of the second band power detection circuit.

4. The RF power amplifier according to claim 3,
   wherein the harmonic termination circuit, which is formed by the series-coupling, is included in a second band output matching circuit coupled to the output terminal of the second band RF amplifier circuit.

5. The RF power amplifier according to claim 4,
   wherein the harmonic termination circuit, which is formed by the series-coupling, is coupled between the ground potential and the input or output terminal of the second band output matching circuit or an intermediate tap between the input and output terminals.

6. The RF power amplifier according to claim 4,
   wherein one end of the second inductor of the output circuit is coupled to the ground potential through a terminating resistor so that the detected signal is generated from the other end of the second inductor.

7. The RF power amplifier according to claim 4,
   wherein the output terminal of the second band output matching circuit can be coupled to a duplexer that provides frequency-division duplex transmission and reception.

8. The RF power amplifier according to claim 4,
   wherein the second frequency band of the RF input signal has RF frequencies of approximately 700 MHz.

9. The RF power amplifier according to claim 8,
   wherein the RF frequencies of approximately 700 MHz are the frequencies of LTE band 5, 8, 12, 13, 14, or 17.

10. The RF power amplifier according to claim 9,
    wherein the second band RF amplifier circuit is a low-frequency band RF power amplifier and the first band RF amplifier circuit is a high-frequency band RF power amplifier,
    wherein the first band RF amplifier circuit receives another RF input signal having the first frequency band higher than the RF input signal supplied to the input terminal of the second band RF amplifier circuit, and the first frequency band of the other RF input signal received by the first band RF amplifier circuit has RF frequencies of LTE band 1, 2 or 4.

11. A method of operating a RF power amplifier that includes a first band RF amplifier circuit to amplify a first frequency band, a second band RF amplifier circuit to amplify a second frequency band and a second band power detection circuit, the method comprising the steps of:

when an RF input signal having the first frequency band is supplied to an input terminal of the first band RF amplifier circuit, causing the first band RF amplifier to subject the RF input signal having the first frequency band to power amplification;

when an RF input signal having the second frequency band is supplied to an input terminal of the second band RF amplifier circuit, causing the second band RF amplifier circuit to subject the RF input signal having the second frequency band to power amplification and generating an RF amplifier output signal having the second frequency band from an output terminal of the second band RF amplifier circuit;

coupling an input terminal of the second band power detection circuit to the output terminal of the second band RF amplifier circuit;

detecting, with the power detection circuit, a harmonic component that is a whole number multiple of a fundamental wave component of the second band RF amplifier output signal; and generating, in accordance with the detected harmonic component, by the second band power detection circuit at an output terminal thereof, a detected signal indicative of the signal level of the fundamental wave component of the RF amplifier output signal, wherein the second band power detection circuit includes an input circuit, which detects the harmonic component, and the input circuit also functions as a harmonic termination circuit that is formed by series-coupling a first inductor to a first capacitor, which is coupled between a ground potential and the output terminal of the second band RF amplifier circuit.

12. The method according to claim 11,
wherein the second band power detection circuit includes an output circuit, which generates the detected signal at the output terminal.

13. The method according to claim 12,
wherein the output circuit includes a second inductor, and
wherein, when the second inductor is electromagnetically coupled to the first inductor of the input circuit, the output circuit operates so that the detected signal generated by the second inductor due to the electromagnetic coupling is generated at the output terminal of the second band power detection circuit.

14. The method according to claim 13,
wherein the harmonic termination circuit, which is formed by the series-coupling, is included in a second band output matching circuit coupled to the output terminal of the second band RF amplifier circuit.

15. The method according to claim 14,
wherein the harmonic termination circuit, which is formed by the series-coupling, is coupled between the ground potential and the input or output terminal of the second band output matching circuit or an intermediate tap between the input and output terminals.

16. The method according to claim 14,
wherein one end of the second inductor of the output circuit is coupled to the ground potential through a terminating resistor so that the detected signal is generated from the other end of the second inductor.

17. The method according to claim 14,
wherein the output terminal of the second band output matching circuit can be coupled to a duplexer that provides frequency-division duplex transmission and reception.

18. The method according to claim 14,
wherein the second frequency band of the RF input signal has RF frequencies of approximately 700 MHz.

19. The method according to claim 18,
wherein the RF frequencies of approximately 700 MHz are the frequencies of LTE band 5, 8, 12, 13, 14, or 17.

20. The method according to claim 19,
wherein the second band RF amplifier circuit is a low-frequency band RF power amplifier and the first band RF amplifier circuit is a high-frequency band RF power amplifier, wherein the first frequency band is higher than the second frequency band, and the first frequency band of the other RF input signal received by the first band RF amplifier circuit has RF frequencies of LTE band 1, 2 or 4.

* * * * *